(12) United States Patent
Chiang et al.

(10) Patent No.: US 7,672,176 B2
(45) Date of Patent: Mar. 2, 2010

(54) WRITING CIRCUIT FOR A PHASE CHANGE MEMORY

(75) Inventors: Pei-Chia Chiang, Taipei (TW); Shyh-Shyuan Sheu, Taichung (TW); Lieh-Chiu Lin, Kaohsiung (TW)

(73) Assignees: Industrial Technology Research Institute, Hsinchu (TW); Powerchip Semiconductor Corp., Hsin-Chu (TW); Nanya Technology Corporation, Kuelshan, Taoyuan (TW); Promos Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 7 days.

(21) Appl. No.: 11/948,486

(22) Filed: Nov. 30, 2007

(65) Prior Publication Data

US 2008/0310217 A1    Dec. 18, 2008

(30) Foreign Application Priority Data

Jun. 13, 2007    (TW) .............................. 96121330 A (51) Int. Cl.
   *G11C 7/22*    (2006.01)
(52) U.S. Cl. .............................. 365/189.16; 365/189.09; 365/189.04; 365/189.02; 365/194

(58) Field of Classification Search ............ 365/189.16, 365/189.09, 190.04, 189.02, 194
See application file for complete search history.

(56) References Cited

U.S. PATENT DOCUMENTS

| 4,225,946 | A | 9/1980 | Neale et al. |
| 6,570,784 | B2 | 5/2003 | Lowrey |
| 2005/0117388 | A1* | 6/2005 | Cho et al. .................... 365/163 |
| 2006/0209585 | A1* | 9/2006 | Tanizaki et al. ............. 365/148 |

* cited by examiner

*Primary Examiner*—Thong Q Le
(74) *Attorney, Agent, or Firm*—Birch, Stewart, Kolasch & Birch, LLP (57) ABSTRACT

A writing circuit for a phase change memory is provided. The writing circuit comprises a driving current generating circuit, a first switch device, a first memory cell and a second switch device. The driving current generating circuit provides a writing current to the first memory cell. The first switch device is coupled to the driving current generating circuit. The first memory cell is coupled between the first switch device and the second switch device. The second switch device is coupled between the first memory cell and a ground, wherein when the driving current generating circuit outputs the writing current to the first memory cell, the second switch device is turned on after the first switch device has been turned on for a first predetermined time period.

11 Claims, 6 Drawing Sheets

WRITING CIRCUIT FOR A PHASE CHANGE MEMORY

BACKGROUND OF THE INVENTION

1. Field of the Invention

The invention relates to a writing circuit for a phase change memory, and more particularly to a fast writing circuit for the phase change memory with one current source.

2. Description of the Related Art

With the growth in the use of portable electronic devices, the demand for non-volatile memory has increased. Among the various kinds of non-volatile memory, phase change memory is the most competitive next generation non-volatile memory due to its higher speed, lower power consumption, higher capacity, reliability, easier process integration and lower cost.

Figure 1:
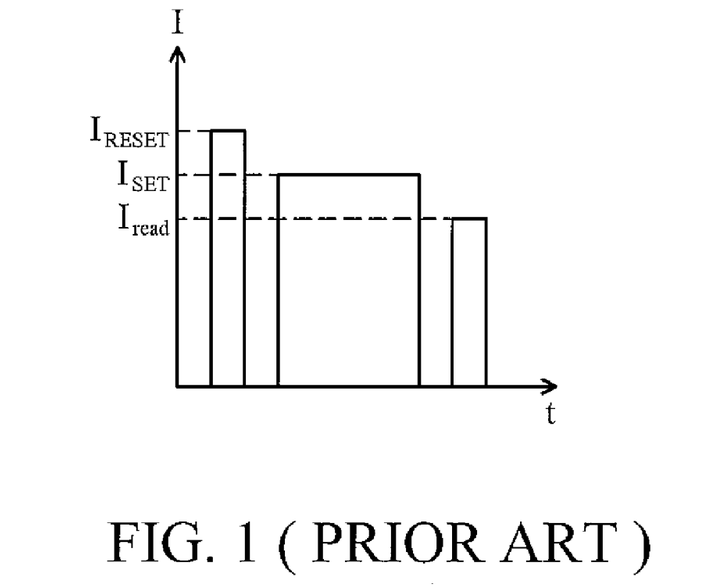
FIG. 1 is a schematic diagram showing the writing current pulse and the reading current pulse of the phase change memory.

The SET and RESET operations are mainly achieved by inputting two current pulses with different current magnitudes to the phase change memory to switch the phase change memory between an amorphous state and a crystalline state. According to Ohm's Law, when the current is input to the phase change memory, the phase change memory is heated. The phase change memory may thus be crystallized or fused based on different currents. Based on the described, the logic state of the phase change memory can be switched by inputting different currents, enabling data storage. FIG. 1 is a schematic diagram showing the writing current pulse and the reading current pulse of the phase change memory. When a RESET operation is applied to the phase change memory, a reset current $I_{RESET}$ with high amplitude and short duration is applied, the phase change memory is thus fused because the temperature of the phase change memory exceeds the fusion temperature of the phase change material of the phase change memory, $T_m$. When the temperature of the phase change memory decreases, the state of the phase change memory is transformed to the amorphous state due to an insufficient cool down period. Thus the phase change memory has high resistance. When a SET operation is applied to the phase change memory, a set current $I_{SET}$ with lower amplitude and longer duration is applied. The phase change memory is heated by the set current $I_{SET}$, and the temperature of the phase change memory is held substantially between the fusion temperature $T_m$ and a crystallizing temperature $T_c$ of the phase change material used by the phase change memory. During the SET operation, the fused phase change memory has sufficient time for crystallizing and the phase change memory thus has low resistance.

Figure 2:
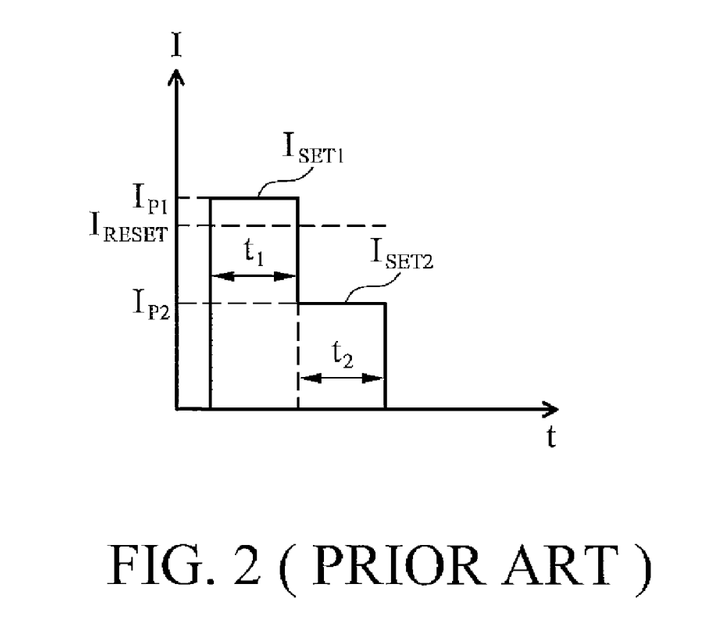
FIG. 2 is a schematic diagram of a convention SET signal for the phase change memory.

FIG. 2 is a schematic diagram of a convention SET signal for the phase change memory. The SET signal comprises a first crystallizing current pulse $I_{SET1}$ and a second crystallizing current pulse $I_{SET2}$. The first crystallizing current pulse $I_{SET1}$ has a first peak current and the duration time of the first peak current $I_{P1}$ is a first time period t1. The second crystallizing current pulse $I_{SET2}$ has a second peak current $I_{P2}$ and the duration time of the second peak current is a second time period t2.

The conventional SET signal is generated by combining two current pulses with different peak currents, and the conventional SET operation is achieved by inputting a SET signal, such as the SET signal illustrated in FIG. 2, to the phase change memory. Comparing the first crystallizing current pulse $I_{SET1}$ and the second crystallizing current pulse $I_{SET2}$, the first peak current is higher than the second peak current, and the first time period is shorter than the second time period. Therefore, when the first crystallizing current pulse $I_{SET1}$ is input to the phase change memory, the phase change material of the phase change memory is quickly heated, and partial phase change material is crystallized. Then, the second crystallizing current pulse $I_{SET2}$ is input to the phase change memory with lower current and longer time, allowing the phase change material to completely crystallized. According to the described operation, the reliability and the uniformity of the phase change memory can be increased.

Figure 3:
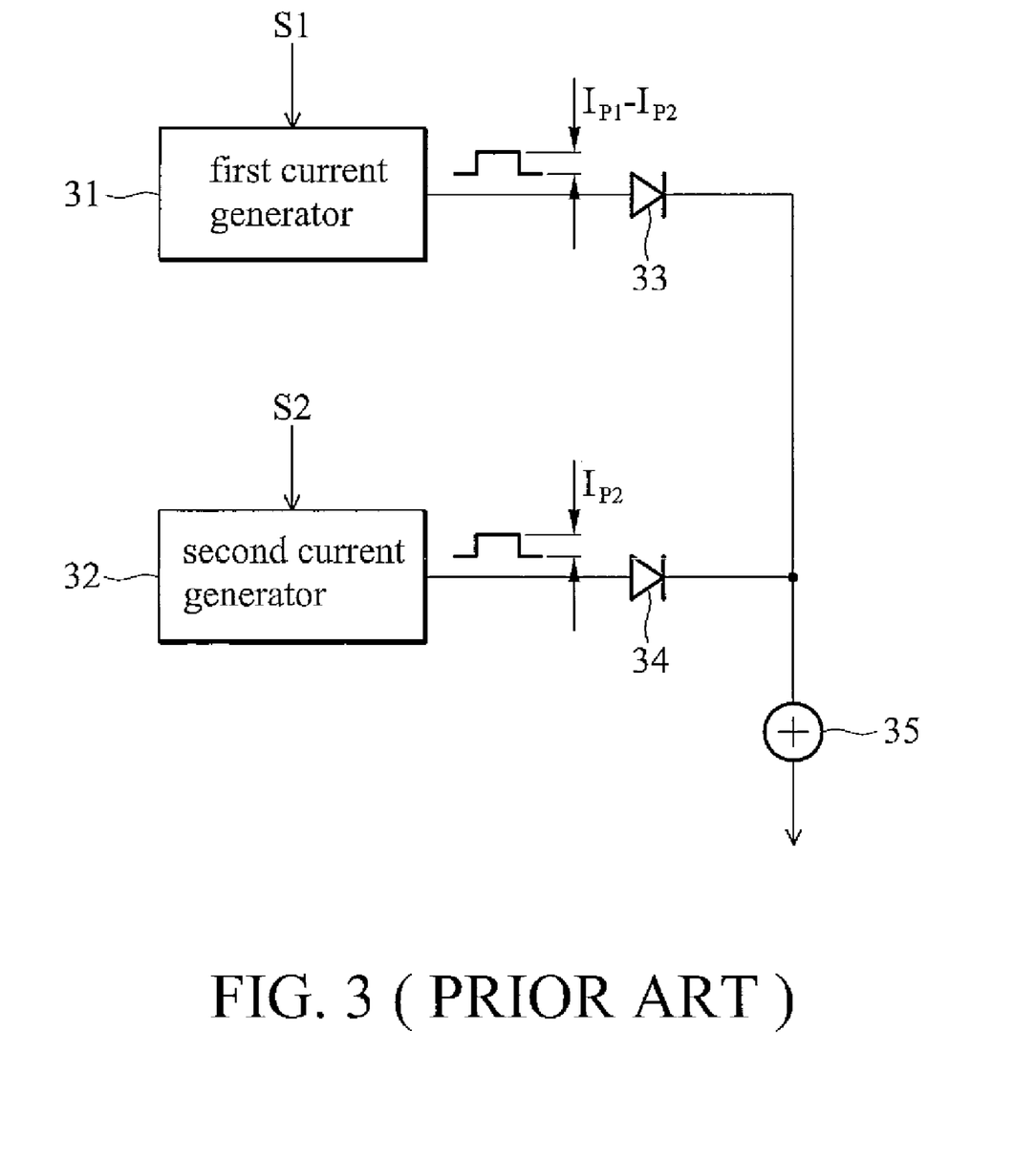
FIG. 3 is a schematic diagram of a current generator outputting the SET signal shown in FIG. 2.

FIG. 3 is a schematic diagram of a current generator outputting the SET signal shown in FIG. 2. The first current generator 31 and the second current generator 32 coupled to the adder 35 respectively via a first diode 33 and a second diode 34. The first current generator 31 outputs a first current pulse having an amplitude of $(I_{P1}-I_{P2})$, and the second current pulse generator outputs a second current pulse having an amplitude of $I_{P2}$. The first current generator 31 and the second current generator 32 simultaneously output the first current pulse and the second current pulse for a duration time t1 based on the control signals S1 and S2. Then, the control signal S1 disables the first current generator 31 to stop outputting the first current pulse and the second control signal S2 controls the second current generator 32 to output the second current pulse for a duration time t2. According to the described operation, the SET signal illustrated in FIG. 2 can be generated.

BRIEF SUMMARY OF THE INVENTION

An embodiment of the invention provides a writing circuit comprising a driving current generating circuit, a first switch device, a first memory cell and a second switch device. The driving current generating circuit provides a writing current to the first memory cell. The first switch device is coupled to the driving current generating circuit. The first memory cell is coupled between the first switch device and the second switch device. The second switch device is coupled between the first memory cell and a ground, wherein when the driving current generating circuit outputs the writing current to the first memory cell, the second switch device is turned on after the first switch device has been turned on for a first predetermined time period.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

To increase the reliability and the uniformity of the phase change memory, the conventional SET operation is achieved by inputting two current pulses with different magnitude, such as shown in FIG. 2, thus, the material of the phase change memory can be first melted and then be crystallized. To achieve that, in the conventional design, multiple current sources or specific current generating circuits are usually utilized; however, this will increase the circuit complexity. For this reason, one embodiment of the invention provides a writing circuit for the phase change memory with only one current source.

Figure 4:
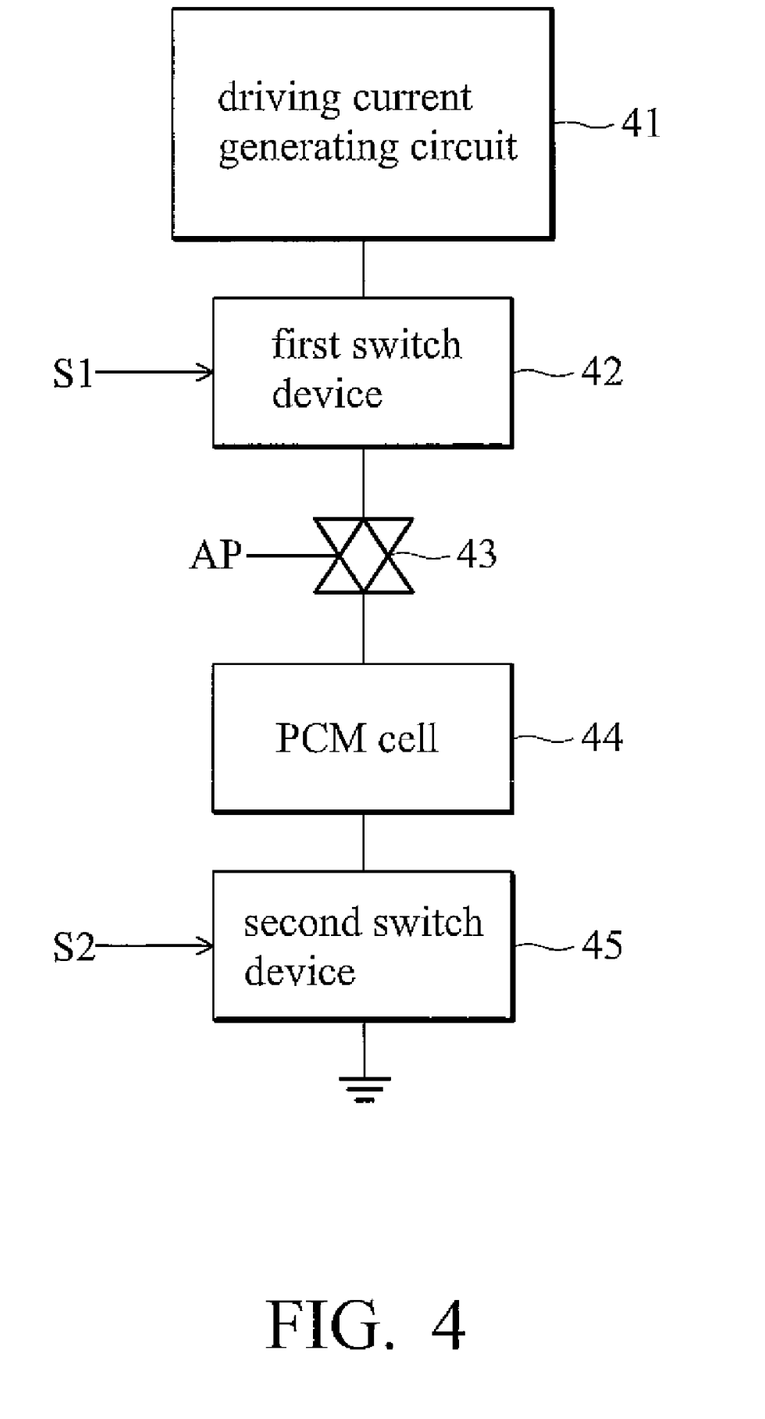
FIG. 4 is a schematic diagram of an embodiment of a writing path of a memory writing control circuit of the invention.

FIG. 4 is a schematic diagram of an embodiment of a writing path of a memory writing control circuit of the invention. The driving current generating circuit 41 coupled to a bias circuit (not shown in FIG. 4) outputs the writing current. The first switch device 42 is coupled to the driving current generating circuit 41, controlled by a control signal S1, and is turned on based on the control signal S1. The transmission gate 43 is coupled to the first switch device 42, controlled by a control signal AP, and is turned on based on the control signal AP. In this embodiment, the transmission gate 43 comprises a CMOS transistor. The PCM memory cell 44 is coupled between the transmission gate 43 and the second switch device 45, and the logic state of the PCM memory cell 44 is determined by the magnitude of the writing current. The second switch device 45 is coupled to the PCM memory cell 44, controlled by a control signal S2, and is turned on based on the control signal S2. When the driving current generating circuit 41 outputs the writing current, the first switch 42 is turned on and the second switch device 45 is turned on after the first switch device 42 has been turned on for a predetermined time period $\Delta t_{WL}$. According to the described operation, the writing current will exceed the RESET current $I_{RESET}$ for a time period $T_{period}$.

Table 1 is a simulation result of the memory writing control circuit illustrated in FIG. 4 by applying the described mechanism. The second switch device 45 is turned on after the first switch device 42 is turned on for a time period $\Delta t_{WL}$. The time period $T_{period}$ is the time period that the writing current is larger than the RESET current $I_{RESET}$. The current $I_{MAX}$ is the maximum peak current. According to the simulation result, the time period $T_{period}$ can be adjusted by adjusting the time period $\Delta t_{WL}$, and therefore the phase change memory can be melted and then be crystallized. Since the degree of melting of the phase change material is based on the magnitude of the maximum peak current $I_{MAX}$, the invention controls the degree of melting of the phase change material by adjusting the time period $\Delta t_{WL}$.

TABLE 1

| $\Delta t_{WL}$ | $T_{period}$ | $I_{MAX}$ |
|---|---|---|
| 0 | 22.8 ns | 378 µA |
| 10 ns | 32.7 ns | 403 µA |
| 20 ns | 42.3 ns | 408 µA |
| 30 ns | 48.7 ns | 409 µA |
| 40 ns | 50.9 ns | 410 µA |
| 50 ns | 51.9 ns | 410 µA |

Figure 5:
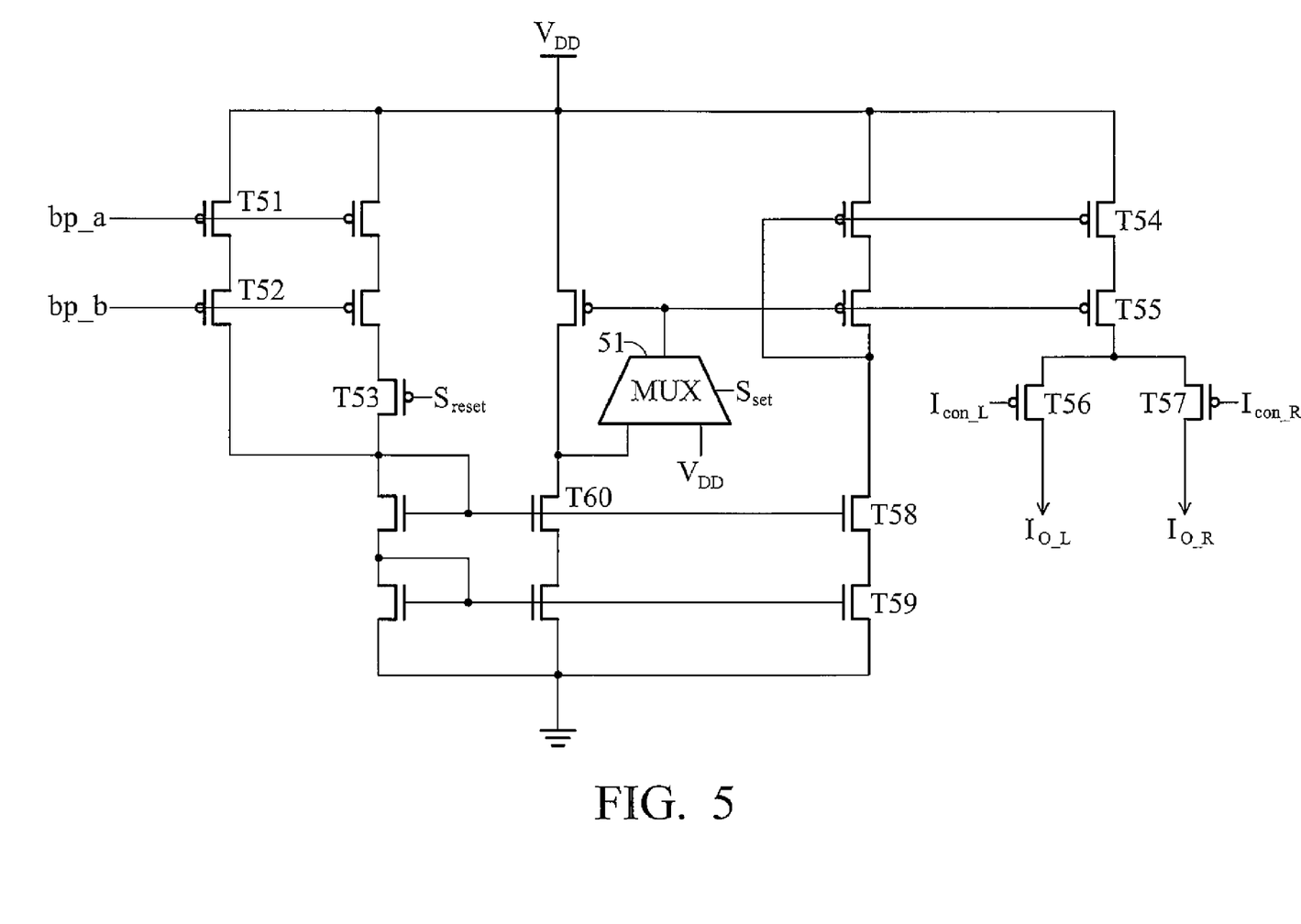
FIG. 5 is a circuit diagram of an embodiment of the driving current generating circuit 41 of the invention.

FIG. 5 is a circuit diagram of an embodiment of the driving current generating circuit 41 of the invention. The driving current generating circuit 41 is coupled to two writing paths and each writing path comprises one or a plurality of memory cells. The driving current generating circuit 41 output the writing currents $I_{o\_L}$ or $I_{o\_R}$ to the writing path based on the control signals $I_{con\_L}$ and $I_{con\_R}$. When the control signals bp_a and bp_b are at high voltage level, the transistors T51 and T52 are turned off. The multiplexer 51 outputs a high voltage $V_{DD}$ to the gate of the transistors T54 and T55, and therefore the driving current generating circuit 41 does not output the writing current. When the driving current generating circuit 41 generates the writing current but does not output the writing current to the writing paths, the control signals bp_a and bp_b are set to be at low voltage level, the transistors T51 and T52 are turned on, and therefore the transistors T58, T59 and T54 are also turned on after the transistors T51 and T52 are turned on. The multiplexer 51 then transmits the voltage of the drain of the transistor T60 to turn on the transistor T55 according to the control signal $S_{set}$. The driving current generating circuit 41 determines to output the writing currents $I_{o\_L}$ or $I_{o\_R}$ according to the control signal $I_{con\_L}$ and $I_{con\_R}$. In this embodiment, the duration time that the writing current exceeds the reset current $I_{RESET}$ can be adjusted by adjusting the time $\Delta t_{set}$, wherein the transistors T56 and T57 are turned of after the transistors T54 and T55 for the time duration $\Delta t_{set}$.

For further illustration, please refer to table 2. Table 2 is a simulation result of the memory writing control circuit illustrated in FIG. 4 by applying the described mechanism. In this embodiment, $\Delta t_{WL}$ is fixed to 10 ns, wherein the second switch device 45 is turned on after the first switch device 42 is tuned on for the time duration $\Delta t_{WL}$. Since the conduct of the transistors T54 and T55 is based on the control signal $S_{set}$, the time duration $\Delta t_{set}$ can also represent the time duration that the transistors T56 and T57 are turned on after the multiplexer 51 receives the control signal $S_{set}$. According to the simulation result, the time period $T_{period}$ can be adjusted by adjusting the time period $\Delta t_{set}$, and therefore the phase change memory can be melted and then be crystallized. Since the degree of melting of the phase change material is based on the magnitude of the maximum peak current $I_{MAX}$, the invention controls the degree of melting of the phase change material by adjusting the time period $\Delta t_{set}$.

TABLE 2

| $\Delta t_{set}$ | $T_{period}$ | $I_{MAX}$ |
|---|---|---|
| 60 ns | 151.4 ns | 410 µA |
| 85 ns | 127.1 ns | 410 µA |
| 110 ns | 103.1 ns | 410 µA |
| 135 ns | 79.3 ns | 410 µA |
| 160 ns | 57.8 ns | 410 µA |
| 1000 ns | 32.7 ns | 403 µA |

Figure 6:
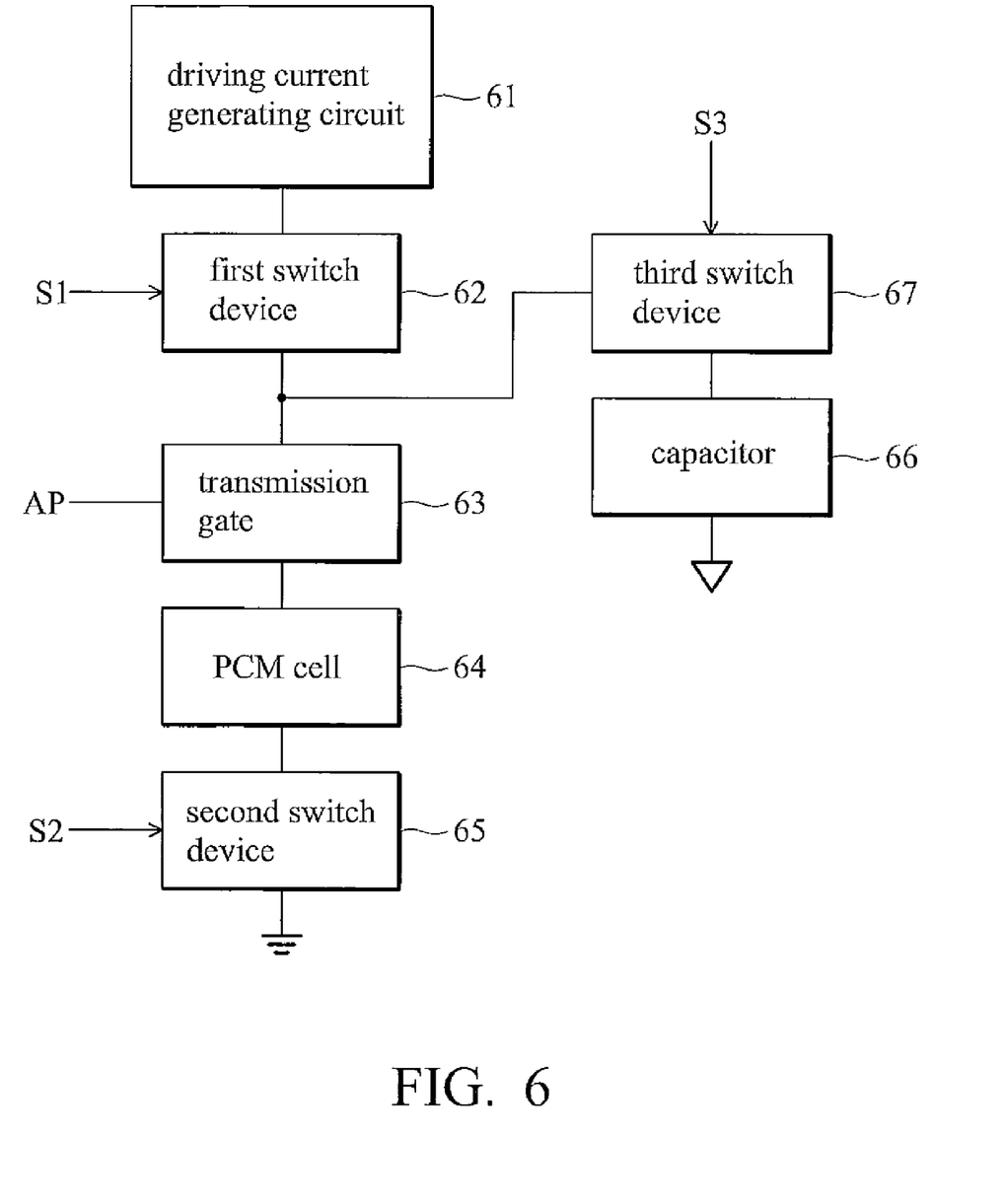
FIG. 6 is a schematic diagram of another embodiment of a writing path of a memory writing control circuit of the invention.

FIG. 6 is a schematic diagram of another embodiment of a writing path of a memory writing control circuit of the invention. The driving current generating circuit 61 coupled to a bias circuit (not shown in FIG. 6) outputs the writing current. The first switch device 62 is coupled to the driving current generating circuit 61, controlled by a control signal S1, and is turned on based on the control signal S1. The transmission gate 63 is coupled to the first switch device 62, controlled by a control signal AP, and is turned on based on the control signal AP. In this embodiment, the transmission gate 63 comprises a CMOS transistor. The PCM memory cell 64 is coupled between the transmission gate 63 and the second switch device 65, and the logic state of the PCM memory cell 64 is determined by the magnitude of the writing current. The second switch device 65 is coupled to the PCM memory cell 64, controlled by a control signal S2, and is turned on based on the control signal S2. The capacitor 66 has two terminals, wherein one terminal is coupled between the first switch device 62 and the PCM memory cell 64, and another terminal is grounded. The third switch device 67 is coupled to the first 62, controlled by a control signal S3, and is turned on based on the control signal S3. In this embodiment, the time duration $T_{period}$ can be adjusted based on the capacitance of the capacitor 66.

For further illustration, please refer to table 3. Table 3 is a simulation result of the memory writing control circuit illustrated in FIG. 4 by applying the described mechanism. In this embodiment, $\Delta t_{WL}$ is fixed to 10 ns, wherein the second switch device 65 is turned on after the first switch device 62 is turned on for the time duration $\Delta t_{WL}$. According to the simulation result, the time period $T_{period}$ can be adjusted based on the capacitance of the capacitor 66, and therefore the phase change memory can be melted first and then be crystallized. Since the degree of melting of the phase change material is based on the magnitude of the maximum peak current $I_{MAX}$, the invention controls the degree of melting of the phase change material by different capacitance of the capacitor 66.

TABLE 3

| Capacitance | $T_{period}$ | $I_{MAX}$ |
| --- | --- | --- |
| 0 p | 32.6 ns | 403 µA |
| 1 p | 39.8 ns | 404 µA |
| 2 p | 47.3 ns | 405 µA |
| 3 p | 55.0 ns | 405 µA |
| 4 p | 62.1 ns | 405 µA |
| 5 p | 69.6 ns | 406 µA |

Figure 7:
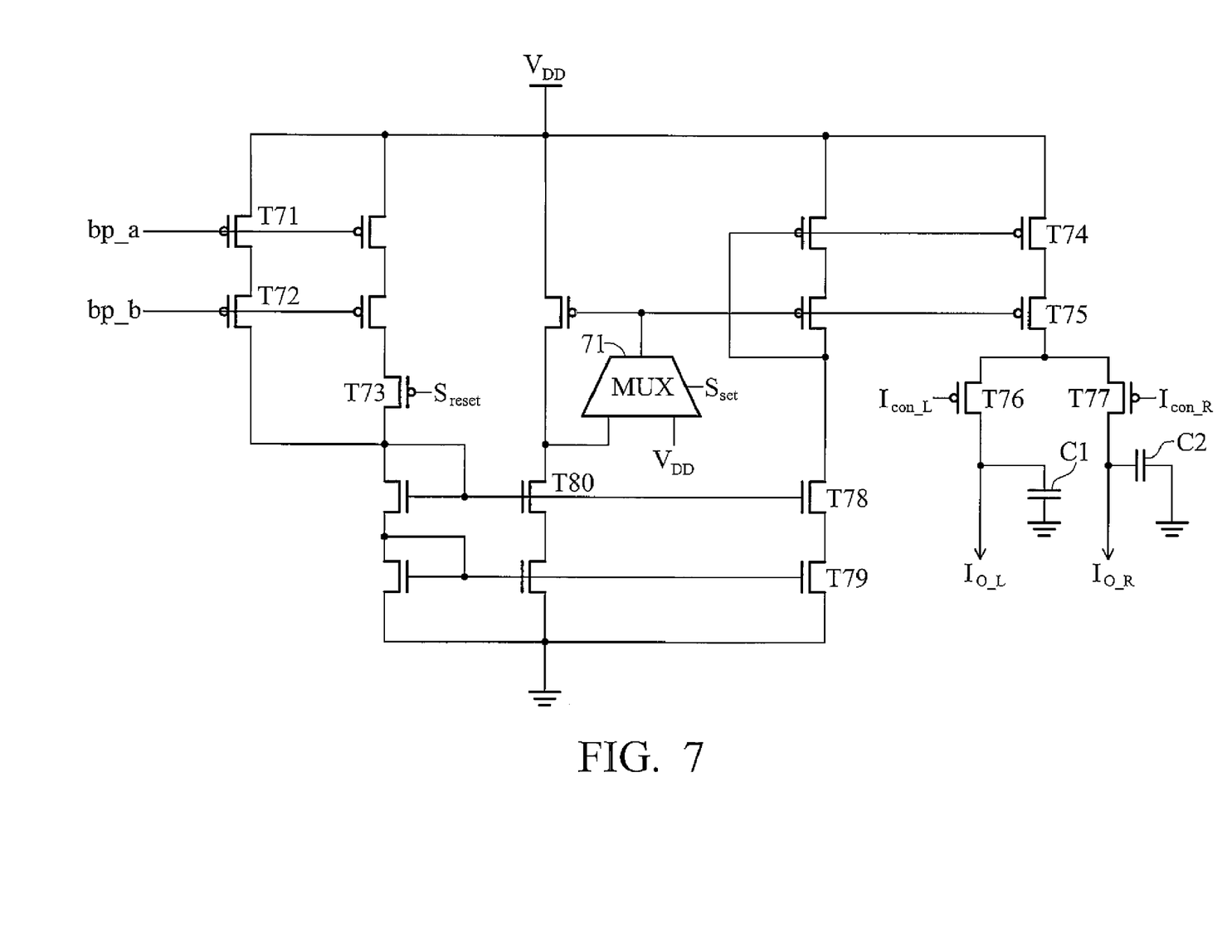
FIG. 7 is a circuit diagram of an embodiment of the driving current generating circuit 61 of the invention.

FIG. 7 is a circuit diagram of an embodiment of the driving current generating circuit 61 of the invention. The driving current generating circuit 61 is coupled to two writing paths and each writing path comprises one or a plurality of memory cells. The driving current generating circuit 61 outputs the writing currents $I_{o\_L}$ or $I_{o\_R}$ to the writing path based on the control signals $I_{con\_L}$ and $I_{con\_R}$. When the control signals bp_a and bp_b are at high voltage level, the transistors T71 and T72 are turned off. The multiplexer 71 outputs a high voltage $V_{DD}$ to the gate of the transistors T74 and T75, and therefore the driving current generating circuit 61 does not output the writing current. When the driving current generating circuit 61 generates the writing current but does not output the writing current to the writing paths, the control signals bp_a and bp_b are set to be at low voltage level, the transistors T71 and T72 are turned on, and therefore the transistors T78, T79 and T74 are also turned on after the transistors T71 and T72 are turned on. The multiplexer 71 then transmits the voltage of the drain of the transistor T80 to turn on the transistor T75 according to the control signal $S_{set}$. The driving current generating circuit 61 determines to output the writing currents $I_{o\_L}$ or $I_{o\_R}$ according to the control signal $I_{con\_L}$ and $I_{con\_R}$. The capacitor C1 has two terminals, wherein one terminal is coupled to the output terminal of the transistor T76, and another terminal is grounded. The capacitor C2 has two terminals, wherein one terminal is coupled to the output terminal of the transistor T77, and another terminal is grounded. In this embodiment, the time period $T_{period}$ can be adjusted based on the capacitance of the capacitors C1 and C2. In this embodiment, although transistors T71 to T77 are illustrated with PMOS transistors, and transistors T78 to T80 are illustrated with NMOS transistors, those skilled in the Art can easily change the PMOS transistor to NMOS transistor or change the NMOS transistor to PMOS transistor based on their preference.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A writing circuit for a phase change memory, comprising:
   a driving current generating circuit to provide a writing current;
   a first switch device coupled to the driving current generating circuit;
   a first memory cell coupled to the first switch device; and
   a second switch device coupled between the first memory cell and a ground,
   wherein when the driving current generating circuit outputs the writing current to the first memory cell, the second switch device is turned on after the first switch device has been turned on for a first predetermined time period;
   wherein the driving current generating circuit comprises:
   a current generator; and
   an output switch device coupled to the current generator; and
   wherein the output switch delays a current from the current generator by a second predetermined time period to generate the writing current.

2. The circuit as claimed in claim 1, further comprising a transmission gate coupled between the first switch device and the first memory cell.

3. The circuit as claimed in claim 1, further comprising a second memory cell, wherein the first memory cell and the second memory cannot receive the writing current at the same time.

4. The circuit as claimed in claim 1, further comprising a capacitor coupled to the first switch device and the ground.

5. The circuit as claimed in claim 1, further comprising a third switch device coupled to a capacitor and the first switch device, wherein when the first switch device is turned on, meanwhile, the third switch device is turned on.

6. A writing circuit for a phase change memory, comprising:
   a driving current generating circuit to provide a writing current;
   a first switch device coupled to the driving current generating circuit;
   a first memory cell coupled to the first switch device; and
   a second switch device coupled between the first memory cell and a ground,
   wherein when the driving current generating circuit outputs the writing current to the first memory cell, the second switch device is turned on after the first switch device has been turned on for a first predetermined time period;
   wherein the driving current generating circuit comprises:
   an output switch device coupled to the first switch device, comprising a control terminal, wherein when the control terminal receives a first voltage, the output switch device is turned on and outputs the writing current; and a multiplexer receiving the first voltage and a second voltage, controlled by a first control signal, wherein when the multiplexer receives the first control signal, the multiplex outputs the first voltage to the output switch device.

7. The circuit as claimed in claim 6, wherein when the output switch device is turned on, the first switch device delays a second predetermined time period to transmit the writing current to the first memory cell.

8. The circuit as claimed in claim 6, further comprising a transmission gate coupled between the first switch device and the first memory cell.

9. The circuit as claimed in claim 6, further comprising a second memory cell, wherein the first memory cell and the second memory cannot receive the writing current at the same time.

10. The circuit as claimed in claim 6, further comprising a capacitor coupled to the first switch device and the ground.

11. The circuit as claimed in claim 6, further comprising a third switch device coupled to a capacitor and the first switch device, wherein when the first switch device is turned on, meanwhile, the third switch device is turned on.

* * * * *